United States Patent
Petersen et al.

(10) Patent No.: US 7,027,333 B2
(45) Date of Patent: Apr. 11, 2006

(54) HIGH RELIABILITY TRIPLE REDUNDANT MEMORY ELEMENT WITH INTEGRATED TESTABILITY AND VOTING STRUCTURES ON EACH LATCH

(75) Inventors: John T. Petersen, Fort Collins, CO (US); Hassan Naser, Fort Collins, CO (US); Jonathan P Lotz, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 10/934,035

(22) Filed: Sep. 3, 2004

(65) Prior Publication Data
US 2006/0050550 A1   Mar. 9, 2006

(51) Int. Cl.
*G11C 7/10* (2006.01)
*G11C 11/00* (2006.01)
*G06F 11/08* (2006.01)
*H03K 5/22* (2006.01)

(52) U.S. Cl. .................. 365/189.05; 365/63; 365/154; 365/189.08; 365/194; 365/206; 327/57; 327/64; 327/76; 714/6; 714/797; 714/820

(58) Field of Classification Search ............... 365/154, 365/189.05; 714/6, 797
See application file for complete search history.

(56) References Cited

U.S. PATENT DOCUMENTS

| | | | |
|---|---|---|---|
| 6,937,527 B1 * | 8/2005 | Lotz et al. ............. | 365/189.05 |
| 2005/0127971 A1 * | 6/2005 | Hoff ......................... | 327/217 |
| 2005/0251729 A1 * | 11/2005 | Lotz et al. .................. | 714/797 |

* cited by examiner

*Primary Examiner*—Amir Zarabian
*Assistant Examiner*—Ly Duy Pham

(57) ABSTRACT

In a preferred embodiment, the invention provides a circuit and method for a high reliability triple redundant latch with integrated testability. Three settable memory elements set an identical logical value into each settable memory element. After the settable memory elements are set, three voting structures with inputs from the first, second, and third settable memory elements, determine the logical value held on each of the settable memory elements. Data may be scanned into and out of the second settable memory element. Data is propagated through the buffer into the third settable memory element. The third settable memory element may be used to scan data out of the triple redundant latch. The propagation delay through a latch is the only propagation delay of the triple redundant latch.

19 Claims, 4 Drawing Sheets ized of HIGH RELIABILITY TRIPLE REDUNDANT MEMORY ELEMENT WITH INTEGRATED TESTABILITY AND VOTING STRUCTURES ON EACH LATCH

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100–800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/hole pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in triple redundant latches while adding only a small increase in physical size of the triple redundant latch and reducing the delay time through a triple redundant latch. In addition, two redundant latches are used to scan data into and from the triple redundant latch.

SUMMARY OF THE INVENTION

In a preferred embodiment, the invention provides a circuit and method for a high reliability triple redundant latch with integrated testability. Three settable memory elements set an identical logical value into each settable memory element. After the settable memory elements are set, three voting structures with inputs from the first, second, and third settable memory elements, determine the logical value held on each of the settable memory elements. Data may be scanned into and out of the second settable memory element. Data is propagated through the buffer into the third settable memory element. The third settable memory element may be used to scan data out of the triple redundant latch. The propagation delay through a latch is the only propagation delay of the triple redundant latch.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
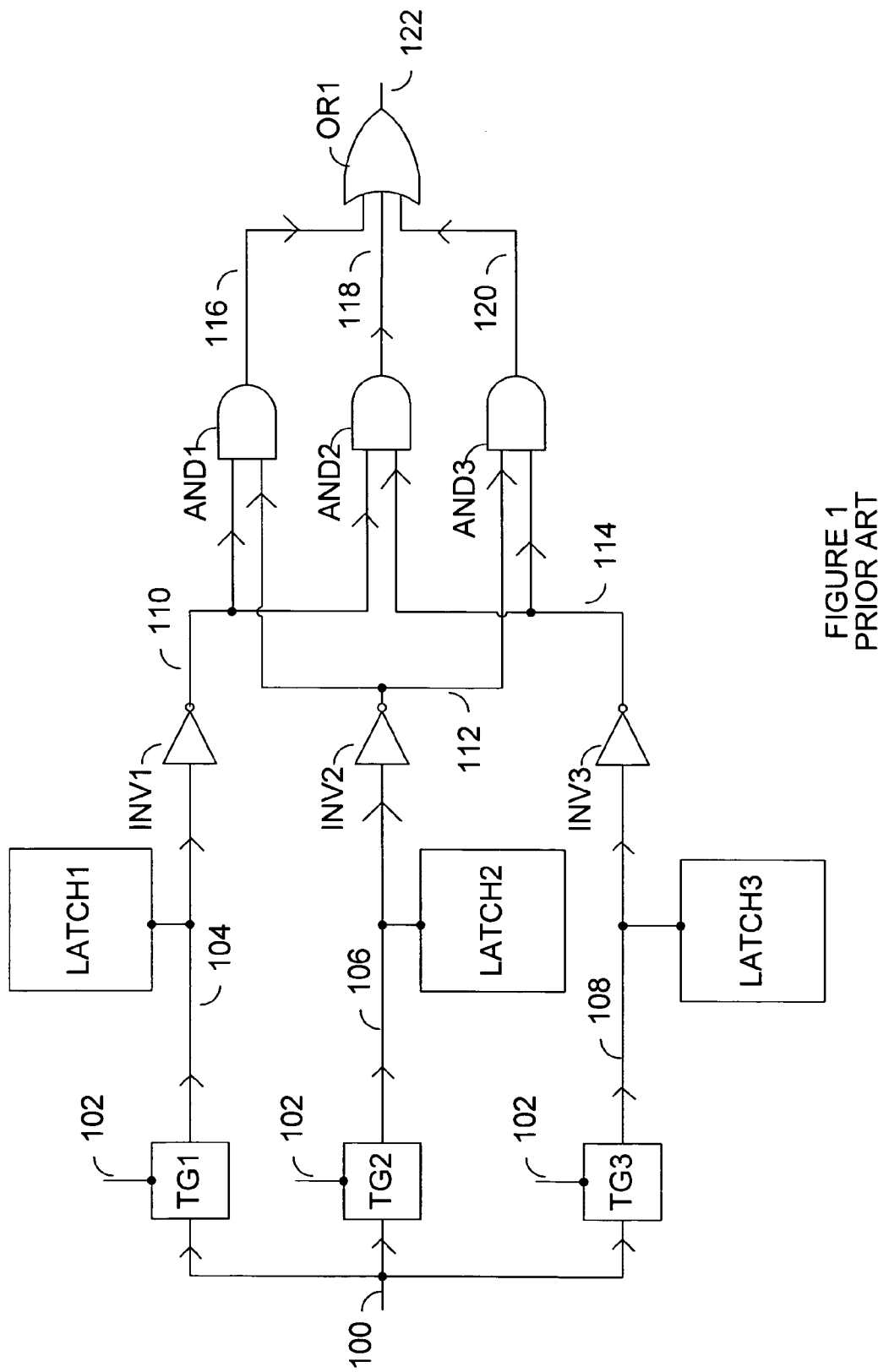
FIG. 1 is a schematic of a triple redundant latch. Prior Art

FIG. 1 is a schematic of a triple redundant latch. The input, 100, to the triple redundant latch is connected to the input of transfer gates, TG1, TG2, and TG3. Control signal, 102, is connected to transfer gates, TG1, TG2, and TG3. Control signal, 102, controls when the signal on the input of transfer gates, TG1, TG2, and TG3 is transferred to the outputs, 104, 106, and 108 of transfer gates, TG1, TG2, and TG3 respectively. The signal presented to outputs, 104, 106, and 108, is stored in LATCH1, LATCH2, and LATCH3 respectively.

After control signal, 102, is turned off, the signal on LATCH1 drives the input of inverter, INV1. After control signal, 102, is turned off, the signal on LATCH2 drives the input of inverter, INV2. After control signal, 102, is turned off, the signal on LATCH3 drives the input of inverter, INV3. The output, 110, of inverter, INV1, drives an input to AND1 and an input to AND2. The output, 112, of inverter, INV2, drives an input to AND1 and an input to AND3. The output, 114, of inverter, INV3, drives an input to AND2 and an input to AND3. The output, 116, of AND1 drives an input of OR1. The output, 118, of AND2 drives an input of OR1. The output, 120, of AND3 drives an input of OR1. The output of the triple redundant latch is the output, 122, of OR1.

A triple redundant latch reduces soft errors by storing the same data in three different latches. For example, when the control signal, 102 is on, a logical high value may be driven from the inputs, 100, of transfer gates, TG1, TG2, and TG3 to the outputs, 104, 106, and 108, of transfer gates, TG1, TG2, and TG3 respectively. After turning control signal 102 off, a logical high value is stored in latches, LATCH1, LATCH2, and LATCH3. The stored logical high value on LATCH1 drives the input of inverter, INV1, and produces a logical low value on the output, 110, of inverter, INV1. The stored logical high value on LATCH2 drives the input of inverter, INV2, and produces a logical low value on the output, 112, of inverter, INV2. The stored logical high value on LATCH3 drives the input of inverter, INV3, and produces a logical low value on the output, 114, of inverter, INV3.

Since the output, 110, 112, and 114 of inverters, INV1, INV2, and INV3, respectively, are low, all the inputs, 110, 112, and 114 to AND1, AND2, and AND3 respectively are a logical low value. Since all the inputs, 110, 112, and 114, to AND1, AND2, and AND3 respectively are a logical low value, the output, 116, 118, and 120 of AND1, AND2, and AND3 respectively are a logical low value. Since the output, 116, 118, and 120 of AND1, AND2, and AND3, respectively are a logical low value, all the inputs of OR1 are a logical low value. Since all the inputs, 116, 118, and 120 to OR1 are logical low value, the output, 122, is logical low value.

If a soft error occurs, for example, in LATCH2, and changes the stored logical value from a logical high value to a logical low value, a logical low value is now presented to the input, 106, of inverter, INV2. The output, 112, of inverter, INV2, presents a logical high value to an input of AND1 and AND3. Since, in this example, the other input, 110 to AND1 and the other input, 114, to AND3, is a logical low value, the output, 116 and 120 of AND1 and AND3 respectively remains a logical low value and the output, 122, does not change. This example illustrates how a single soft error in one latch does not change the original stored value in a triple redundant latch.

As a further example, assume, in addition to the soft error in LATCH2, there is an additional soft error in LATCH3. Now, the input, 108, to inverter, INV3, is a logical low value and as a result, the output, 114, of inverter, INV3, is a logical high value. A logical high value in now presented to an input, 114, of AND2, and to an input, 114, of AND3. Since a logical low and logical high value are presented on the inputs of AND1, the output, 116 of AND1 is still a logical low value. Since a logical low and logical high value are presented on the inputs of AND2, the output, 118 of AND2 is still a logical low value. However, since inputs, 112 and 114, to AND3 are a logical high value, the output, 120, is a logical high value. Since input, 120, to OR1 is a logical high value, the output, 122, changes from a logical low value to a logical high value. This example illustrates how soft errors in two latches of a triple redundant latch do change the original stored value of the triple redundant latch.

A triple redundant latch prevents a single soft error from changing the original value stored in the latch. However, this comes at the cost of additional circuitry which results in a physically larger latch. In addition, a triple redundant may introduce time delay in the delay path of the latch. As consequence, a triple redundant latch is usually larger and slower than a single latch.

Figure 2:
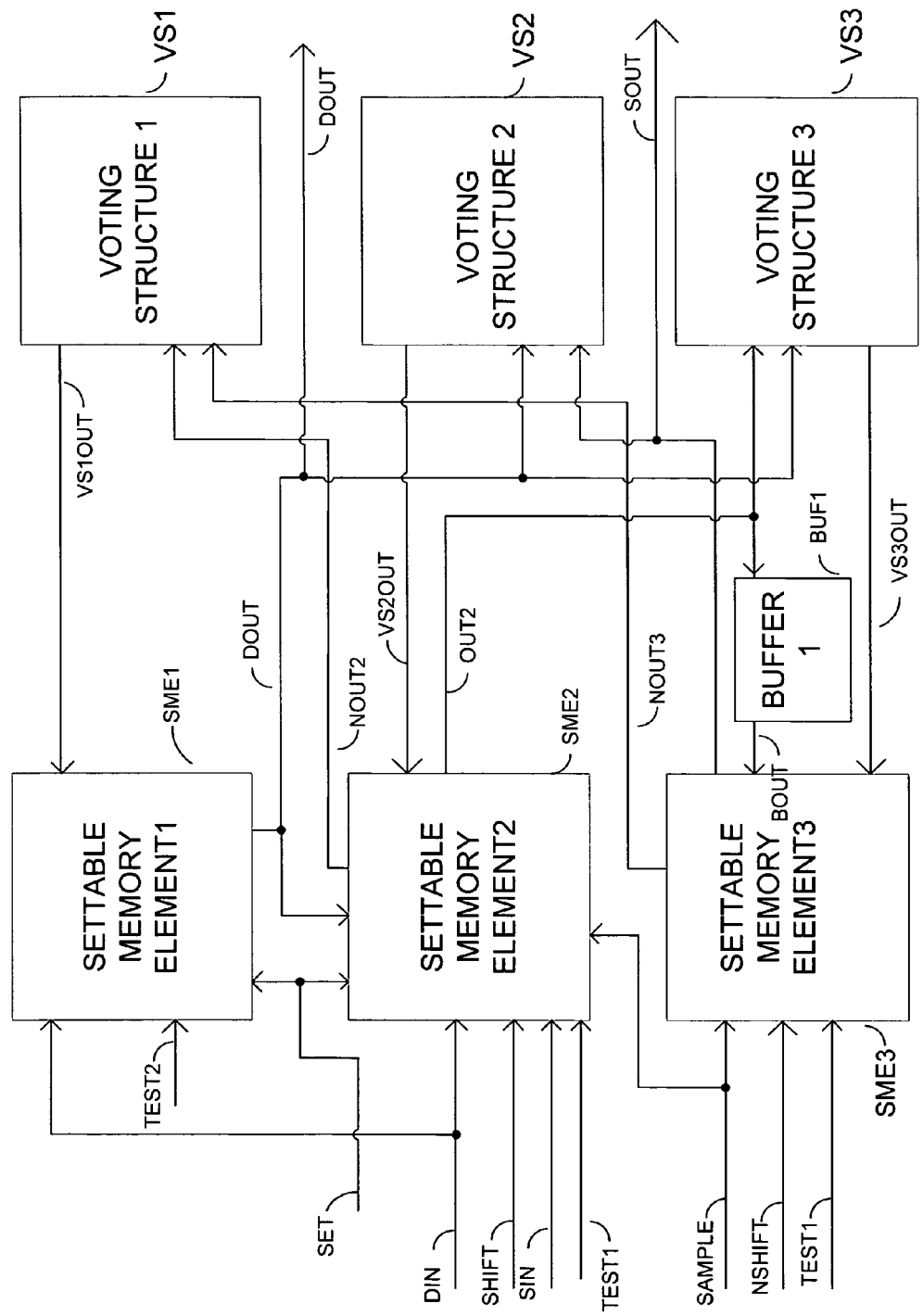
FIG. 2 is a block diagram of an embodiment of an improved triple redundant latch with integrated testability.

FIG. 2 is a block diagram of an embodiment of an improved triple redundant latch. In this embodiment, an identical logical value, data-in, DIN, is set into settable memory element1, SME1, settable memory element2, SME2, and settable memory element 3, SME3, by controlling signal SET. After an identical logical value, DIN, is set into settable memory element1, SME1, settable memory element 2, SME2, and settable memory element 3, SME3, by controlling signal SET, the identical logical value is held in the three settable memory elements, SME1, SME2, and SME3. The voting structure, VS1, after an identical logical value, DIN, is set into settable memory element1, SME1, settable memory element2, SME2, and settable memory element 3, SME3, determines the logical value presented on the output, VS1 OUT, of voting structure VS1, based on the logical values on nodes, NOUT2 and NOUT3. The voting structure, VS2, after an identical logical value, DIN, is set into settable memory element1, SME1, settable memory element2, SME2, and settable memory element 3, SME3, determines the logical value presented on the output, VS2OUT, of voting structure VS2, based on the logical values on nodes, DOUT and SOUT. The voting structure, VS3, after an identical logical value, DIN, is set into settable memory element1, SME1, settable memory element2, SME2, and settable memory element 3, SME3, determines the logical value presented on the output, VS3OUT, of voting structure VS3, based on the logical values on nodes, DOUT and OUT2.

If the logical value, DIN, stored in the settable memory element 1, SME1, is disturbed by a soft error event, and the other two settable memory elements, SME2 and SME3, are not disturbed by a soft error event, the voting structure 1, VS1, will restore the original logical value stored in the settable memory element 1, SME1.

If the logical value, DIN, stored in the settable memory element 2, SME2, is disturbed by a soft error event, and the other two settable memory elements, SME1 and SME3, are not disturbed by a soft error event, the voting structure 2, VS2, will restore the original logical value stored in the settable memory element 2, SME2.

If the logical value, DIN, stored in the settable memory element 3, SME3, is disturbed by a soft error event, and the other two settable memory elements, SME1 and SME2, are not disturbed by a soft error event, the voting structure 3, VS3, will restore the original logical value stored in the settable memory element 3, SME3.

If the logical value stored in settable memory element two, SME2, is disturbed by a soft error event, the voting structures, VS1 and VS3, will tri-state their outputs, VS1OUT and VS3OUT respectively, leaving the original logical value stored in settable memory elements, SME1 and SME3. If the two settable memory elements, for example, SME2 and SME3, are disturbed by a soft error event, at nearly the same time, the logical value original stored in the triple redundant latch may fail. The triple redundant latch will most likely not fail unless two or more soft error events occur at nearly the same time. If a single soft error event occurs and changes the logical value on a settable memory element, the voting structure on that settable memory element will restore the correct value to that settable memory element.

The original logical value stored in the triple redundant latch may be scanned from the triple redundant latch for test purposes. The logical value, DIN, held on settable memory 2, SM2, is presented to the input, OUT2, of buffer1, BUF1. The output, BOUT, of buffer 1, BUF1, is presented to the input of transfer gate 9, TG9. Activating control signal, NSHIFT, with the system clocks halted, allows the logical value presented on BOUT to be propagated to the output, SOUT. The logical value on SOUT may be scanned to a tester to be evaluated.

Scan data, SIN, may also be scanned into the triple redundant latch. When control signal, SHIFT, is activated and control signal, SET, is inactivated, and the system clocks are halted, scan data, SIN, may be scanned into settable memory element 2, SME2. Next, the scan data may be scanned into settable memory element 3, SME3, by keeping control signal, SET, inactivated, inactivating control signal SHIFT, and activating control signal, NSHIFT. The logical value scanned into settable memory elements, SME2 and SME3, may be forced into settable memory element 1, SME1, if control signal, TEST2 is high, and control signal, NTEST2, is low. Because the output, VS1OUT, of voting structure 1, VS1, produces the same logical value that is scanned into settable memory elements, SME2 and SME3, the same logical value scanned into settable memory elements, SME2 and SME3, may be forced onto settable memory element 1, SME1.

During sample-on-the-fly, a test mode may be turned on with the system clocks running. The initial logical values stored in settable memory elements, SME2 and SME3 will be the same as the logical value stored in settable memory element, SME1. As the system clocks run, the logical value in settable memory element 1, SME1, will possibly change. On any subsequent system clock cycle, the signal, SAMPLE, may be activated to load the latest value from settable memory element 1, SME1, to settable memory elements, SME2 and SME3. After loading this logical value into settable memory elements, SME2 and SME3, the logical value may be scanned out using the control signals, SHIFT and NSHIFT.

The propagation delay through the triple redundant latch shown in FIG. 2 is determined only by the propagation delay of settable memory element, SME1. This embodiment of the invention significantly improves the delay time of a triple redundant latch. The delay time through the prior art shown in FIG. 1, for example, includes the propagation delay through the slowest latch among latches LATCH1, LATCH2, and LATCH3, the propagation delay through an inverter, INV2, the propagation delay through an AND gate, AND2, and the propagation delay through an OR gate, OR1.

Figure 3:
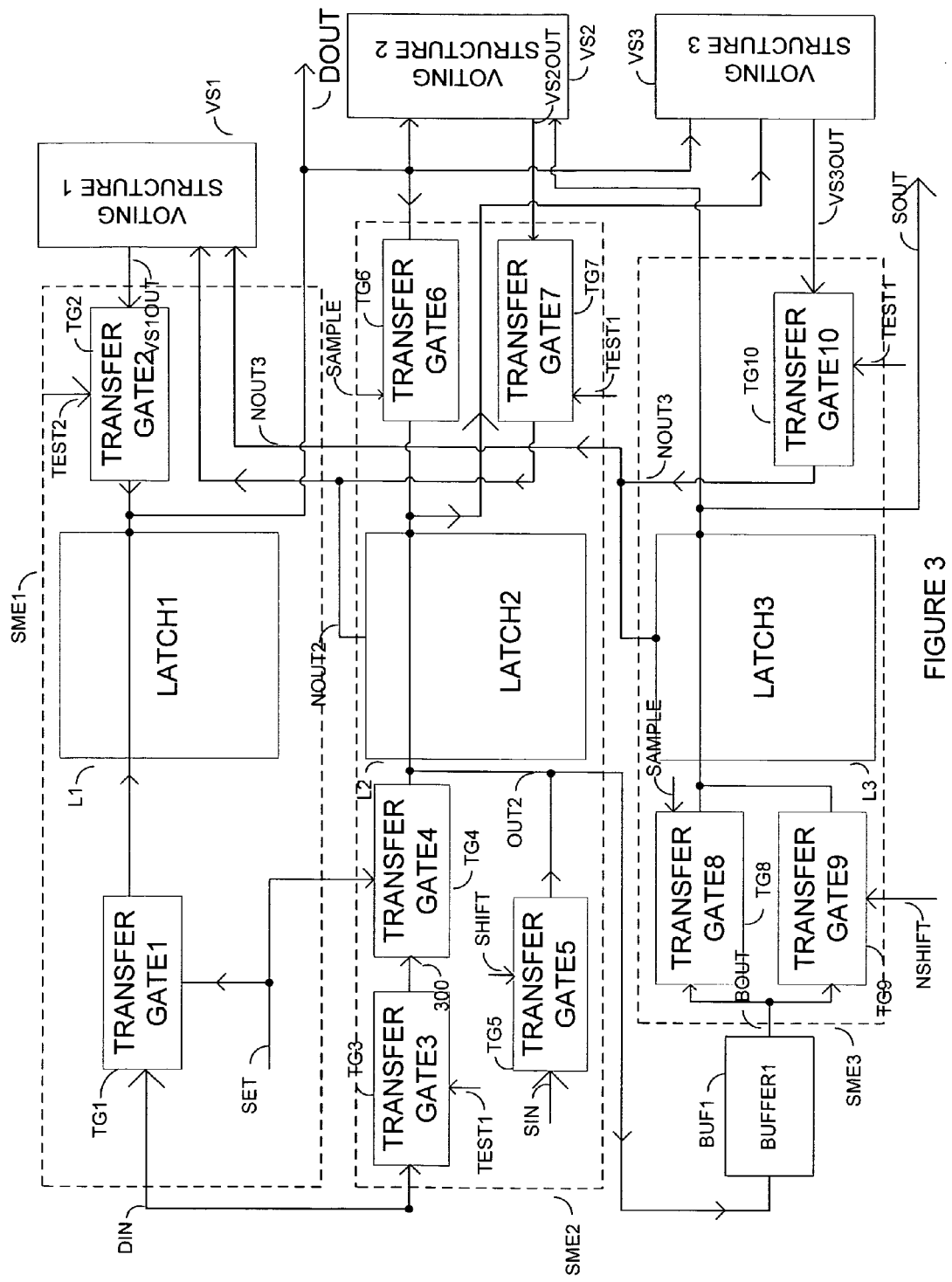
FIG. 3 is a block diagram of an improved triple redundant latch with integrated testability.

FIG. 3 is a block diagram of a triple redundant latch with improved delay, higher reliability, and integrated testability. The input of the triple redundant latch shown in this example is connected to the inputs, DIN, of transfer gates, TG1, and TG3. In addition, a tristatable input inverter, a cross-coupled NAND gate, and a cross-coupled NOR gate may used in place of a transfer gate. If the control signal, SET, is on, the signal at the input, DIN, of transfer gates, TG1 and TG3, is transferred to the output, DOUT, of transfer gate 1, TG1, and the output, 300, of transfer gate 3, TG3. The logical value presented on the output, DOUT, of transfer gate TG1, is also an input to latch1, L1. The logical value presented on the output, 300, of transfer gate TG3, is also an input to transfer gate 4, TG4. If transfer gate 4, TG4, is activated, the logical value on the input, 300, will be presented to the input of latch 2, L2. The logical value presented on the output, SOUT, of transfer gates TG8 and TG9, is also connected to the input, SOUT, of the latch3, L3.

The output, NOUT2, of latch2, L2, is connected to an input of voting structure, VS1, and the output of transfer gate 7, TG7. The output, NOUT3, of latch3, L3, is connected to an input of the voting structure, VS1 and to the output of transfer gate 10, TG10.

The input, DOUT, of latch1, L1, is connected to an input of voting structure, VS2, an input of voting structure, VS3, the output of transfer gate 2, TG2 and the input of transfer gate 6, TG6. The input, OUT2, of latch2, L2, is connected to an input of the voting structure, VS3, the output of transfer gate 5, TG5, the input of buffer 1, BUF1 and to the output of transfer gate 6, TG6. The input, SOUT, of latch3, L3, is connected to an input of the voting structure, VS2, the output of transfer gate 8, TG8, and the output of transfer gate 9, TG9.

As an example of how redundancy applies for this embodiment, assume that a logical high value is stored. Storage nodes DOUT, OUT2, and SOUT each have a logical high value stored in this example. The output, NOUT2, of latch2, L2, provides a logical low value to an input of voting structure 1, VS1. The output, NOUT3, of latch3, L3, provides a logical low value to an input of voting structure 1, VS1. Since both inputs to the voting structure, VS1, are a low logical value, the output is a logical high value. If the control signal, TEST2 is activated, the high logical value on VS1OUT is transferred to DOUT.

If, in this example, a soft error event changes the logical value stored on latch1, L1, from a logical high value to a logical low value, voting structure 1, VS1, will restore the original logical high value stored in latch 1, L1, restoring the triple redundant latch to its original undisturbed state. As a result, the triple redundant latch retains the original logical value stored on it despite a single soft error.

If, in this example, a soft error event changes the logical value stored on latch2, L2, from a logical high value to a logical low value, voting structure 1, VS1, will be tri-stated and the original value stored in latch 1, L1, will remained a logical high value. As a result, the triple redundant latch retains the original logical value stored on it despite a single soft error.

If, in this example, a soft error event changes the logical value stored on latch3, L3, from a logical high value to a logical low value, voting structure 1, VS1, will be tri-stated and the original value stored in latch 1, L1, will remained a logical high value. As a result, the triple redundant latch retains the original logical value stored on it despite a single soft error.

If, however, in this example, a soft error event changes the values stored on nodes OUT2 and SOUT, at nearly the same time, the triple redundant latch may change from its original value. If a soft error event changes the logical values stored on nodes OUT2 and OUT3, at nearly the same time, from logical high values to a logical low values, the inputs, NOUT2 and SOUT, to voting structure 1, VS1, change from logical low values to logical high values. As a result of having logical high values on the inputs, NOUT2 and SOUT, the output, VS1OUT, of voting structure 1, VS1, is a logical low value. As a result, the logical value stored on DOUT is changed from the original logical high value to a logical low value. In this example, the original value stored in the triple redundant latch is changed from a logical high value to a logical low value. The triple redundant latch should not fail unless two or more soft error events occur at nearly the same time. If a single soft error event occurs and changes the logical value on a settable memory element, the voting structure on that settable memory element will restore the correct value to that settable memory element.

The original logical value stored in the triple redundant latch may be scanned from the triple redundant latch for test purposes. The logical value held in latch 2, L2, is presented to the input, OUT2, of buffer1, BUF1. The output, BOUT, of buffer 1, BUF1, is presented to the input of transfer gate 9, TG9. Activating control signal, NSHIFT, allows the logical value presented on BOUT to be propagated to the output, SOUT and stored in latch 3, L3. The logical value on SOUT may be scanned to a tester to be evaluated.

Scan data, SIN, may also be scanned into the triple redundant latch. When control signal, SHIFT, is activated and control signal, SET, is inactivated, scan data, SIN, may be transferred through transfer gate 5, TG5, into latch2, L2. Next, the scan data is propagated through buffer 1, BUF1, and presented to the input of transfer gate 9, TG9. Scan data may be scanned into latch 3, L3, by keeping control signal, SET, inactivated, inactivating control signal SHIFT, and activating control signal, NSHIFT. The logical value scanned into latches, L2 and L3, may be forced into latch 1, L1, when control signal, TEST2, is active. Because the output, VS1OUT, of voting structure 1, VS1, produces the same logical value that is scanned into latches, L2 and L3, the same logical value scanned into latches, L2 and L3, may be forced onto latch 1, L1.

During sample-on-the-fly, a test mode may be turned on with the system clocks running. The initial logical values stored in latches, L2 and L3 will be the same as the logical value stored in latch 1, L1. As the system clocks run, the logical value in latch 1, L1, will possibly change. On any subsequent system clock cycle, the signal, SAMPLE, may be activated to load the latest value from latch 1, L1, to latches, L2 and L3. After loading this logical value into latches, L2 and L3, the logical value may be scanned out using the control signals, SHIFT and NSHIFT.

In addition to improving the soft error rate of a latch, the triple redundant latch shown in FIG. 3 also reduces the delay time through a triple redundant latch because the number of logic delays is reduced.

Figure 4:
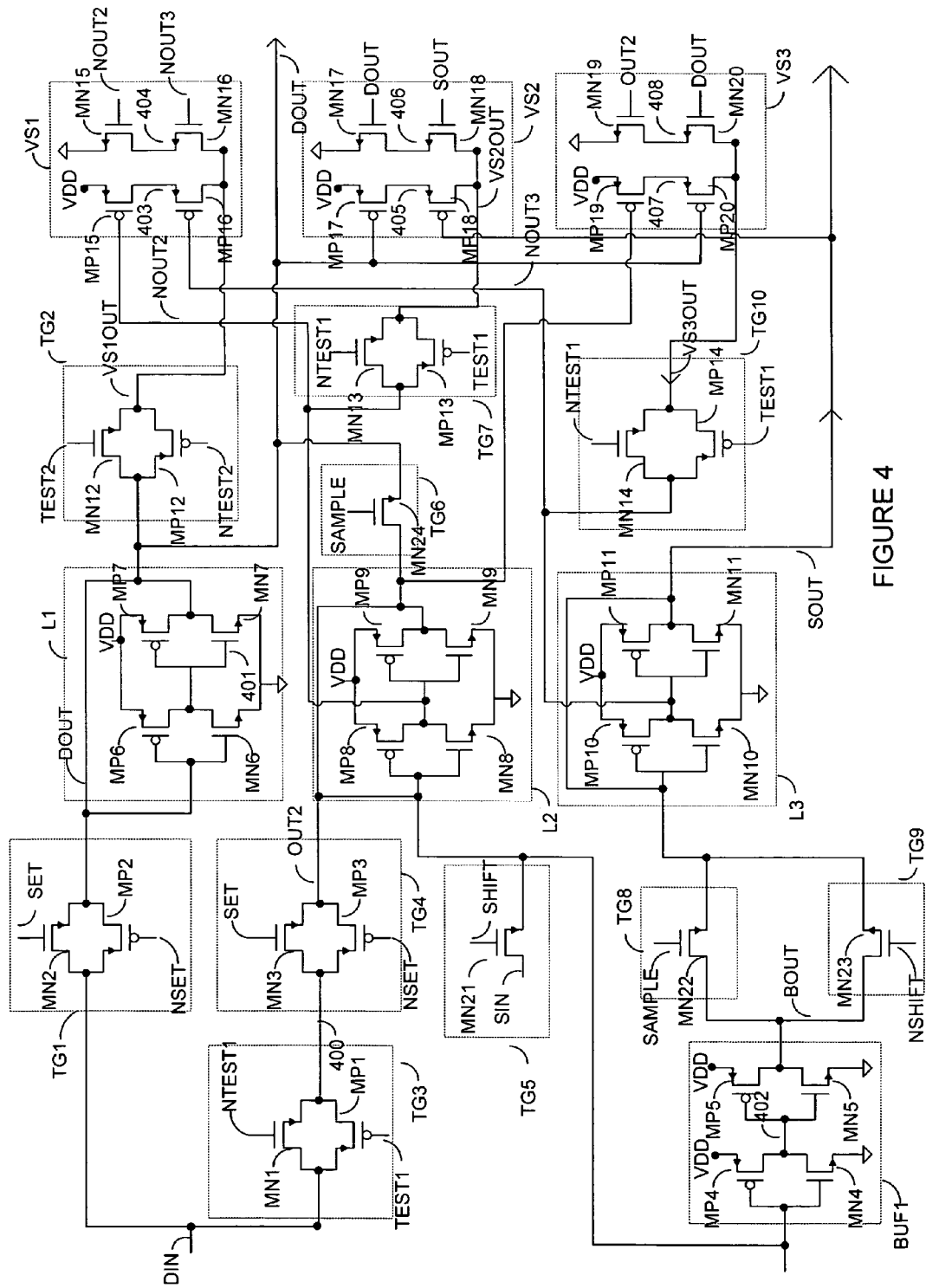
FIG. 4 is a schematic of an improved triple redundant latch with integrated testability.

FIG. 4 is a schematic of an improved triple redundant latch. FIG. 4 contains the same basic blocks that FIG. 3 contains; transfer gate 1, TG1, transfer gate 2, TG2, transfer gate 3, TG3, transfer gate 4, TG4, transfer gate 5, TG5, transfer gate 6, TG6, transfer gate 7, TG7, transfer gate 8, TG8, transfer gate 9, TG9, transfer gate 10, TG10, latch1, L1, latch2, L2, latch3, L3, voting structure 1, VS1, voting structure 2, VS2, voting structure 3, VS3, and buffer1, BUF1.

An embodiment of a transfer gate 1, TG1, for the triple redundant latch contains a PFET, MP2 and an NFET MN2. In this embodiment, the drains of PFET, MP2, and NFET, MN2, are connected to the input, DIN, of transfer gate 1, TG1. The sources of PFET, MP2, and NFET, MN2, are connected to the output, DOUT, of transfer gate 1, TG1. The gate of PFET, MP2, is connected to the control input, NSET, of transfer gate 1, TG1. The gate of NFET, MN2, is connected to the control input, SET, of transfer gate 1, TG1.

An embodiment of a transfer gate 3, TG3, for the triple redundant latch contains a PFET, MP1 and an NFET MN1. In this embodiment, the drains of PFET, MP1, and NFET, MN1, are connected to the input, DIN, of transfer gate 3, TG3. The sources of PFET, MP1, and NFET, MN1, are connected to node, 400, of transfer gate 3, TG3. The gate of PFET, MP1, is connected to the control input, TEST1, of transfer gate 3, TG3. The gate of NFET, MN1, is connected to the control input, NTEST1, of transfer gate 3, TG3.

An embodiment of a transfer gate 2, TG2, for the triple redundant latch contains a PFET, MP12 and an NFET MN12. In this embodiment, the drains of PFET, MP12, and NFET, MN12, are connected to, VS1OUT, of transfer gate 2, TG2. The sources of PFET, MP12, and NFET, MN12, are connected to the output, DOUT, of transfer gate 2, TG2. The gate of PFET, MP12, is connected to the control input, NTEST2, of transfer gate 2, TG2. The gate of NFET, MN12, is connected to the control input, TEST2, of transfer gate 2, TG2.

An embodiment of a transfer gate 4, TG4, for the triple redundant latch contains a PFET, MP3 and an NFET MN3. In this embodiment, the drains of PFET, MP3, and NFET, MN3, are connected to the input, 400, of transfer gate 4, TG4. The sources of PFET, MP3, and NFET, MN3, are connected to the output, OUT2, of transfer gate 4, TG4. The gate of PFET, MP3, is connected to the control input, NSET, of transfer gate 4, TG4. The gate of NFET, MN3, is connected to the control input, SET, of transfer gate 4, TG4.

An embodiment of a transfer gate 7, TG7, for the triple redundant latch contains a PFET, MP13 and an NFET MN13. In this embodiment, the drains of PFET, MP13, and NFET, MN13, are connected to, VS2OUT, of transfer gate 7, TG7. The sources of PFET, MP13, and NFET, MN13, are connected to the output, NOUT2, of transfer gate 7, TG7. The gate of PFET, MP13, is connected to the control input, TEST1, of transfer gate 7, TG7. The gate of NFET, MN13, is connected to the control input, NTEST1, of transfer gate 7, TG7.

An embodiment of a transfer gate 10, TG10, for the triple redundant latch contains a PFET, MP14 and an NFET MN14. In this embodiment, the drains of PFET, MP14, and NFET, MN14, are connected to the input, VS3OUT, of transfer gate 10, TG10. The sources of PFET, MP14, and NFET, MN14, are connected to the output, NOUT3, of transfer gate 10, TG10. The gate of PFET, MP14, is connected to the control input, TEST1, of transfer gate 10, TG10. The gate of NFET, MN14, is connected to the control input, NTEST1, of transfer gate 10, TG10.

An embodiment of a transfer gate 5, TG5, for the triple redundant latch contains an NFET MN21. In this embodiment, the drain of NFET, MN21, is connected to the input, SIN, of transfer gate 5, TG5. The source of NFET, MN21, is connected to the output, OUT2, of transfer gate 5, TG5. The gate of NFET, MN21, is connected to the control input, SHIFT, of transfer gate 5, TG5.

An embodiment of a transfer gate 6, TG6, for the triple redundant latch contains an NFET MN24. In this embodiment, the drain of NFET, MN24, is connected to the input, DOUT, of transfer gate 6, TG6. The source of NFET, MN24, is connected to the output, OUT2, of transfer gate 6, TG6. The gate of NFET, MN24, is connected to the control input, SAMPLE, of transfer gate 6, TG6.

An embodiment of a transfer gate 8, TG8, for the triple redundant latch contains an NFET MN22. In this embodiment, the drain of NFET, MN22, is connected to the input, BOUT, of transfer gate 8, TG8. The source of NFET, MN22, is connected to the output, SOUT, of transfer gate 8, TG8. The gate of NFET, MN22, is connected to the control input, SAMPLE, of transfer gate 8, TG8.

An embodiment of a transfer gate 9, TG9, for the triple redundant latch contains an NFET MN23. In this embodiment, the drain of NFET, MN23, is connected to the input, BOUT, of transfer gate 9, TG9. The source of NFET, MN23, is connected to the output, SOUT, of transfer gate 9, TG9. The gate of NFET, MN23, is connected to the control input, NSHIFT, of transfer gate 9, TG9.

An embodiment of latch1, L1, for the triple redundant latch contains PFET, MP6, NFET, MN6, PFET, MP7, and NFET, MN7. In this embodiment, the gate of PFET, MP6, and the gate of NFET, MN6, is connected to the drain of PFET, MP7 and to the drain of NFET, MN7, the input, DOUT, of latch1, L1. The drain of PFET, MP6, and the drain of NFET, MN6, is connected to the gate of PFET, MP7 and to the gate of NFET, MN7, the output, 401, of latch1, L1. The sources of PFET, MP6 and PFET, MP7 are connected to VDD. The sources of NFET, MN6, and NFET, MN7 are connected to GND.

An embodiment of latch2, L2, for the triple redundant latch contains PFET, MP8, NFET, MN8, PFET, MP9, and NFET, MN9. In this embodiment, the gate of PFET, MP8, and the gate of NFET, MN8, is connected to the drain of PFET, MP9 and to the drain of NFET, MN9, the input, OUT2, of latch2, L2. The drain of PFET, MP8, and the drain of NFET, MN8, is connected to the gate of PFET, MP9 and to the gate of NFET, MN9, the output, NOUT2, of latch2, L2. The sources of PFET, MP8 and PFET, MP9 are connected to VDD. The sources of NFET, MN8, and NFET, MN9 are connected to GND.

An embodiment of latch3, L3, for the triple redundant latch contains PFET, MP10, NFET, MN10, PFET, MP11, and NFET, MN11. In this embodiment, the gate of PFET, MP10, and the gate of NFET, MN10, is connected to the drain of PFET, MP11 and to the drain of NFET, MN11, the input, SOUT, of latch3, L3. The drain of PFET, MP10, and the drain of NFET, MN10, is connected to the gate of PFET, MP11 and to the gate of NFET, MN11, the output, NOUT3, of latch3, L3. The sources of PFET, MP10 and PFET, MP11 are connected to VDD. The sources of NFET, MN10, and NFET, MN11 are connected to GND.

An embodiment of voting structure 1, VS1, for the triple redundant latch contains PFET, MP15, PFET, MP16, NFET, MN15, and NFET, MN16. In this embodiment, the gates of PFET, MP15, and NFET, MN15, are connected to the first input, NOUT2, of voting structure 1, VS1. The gates of PFET, MP16, and NFET, MN16, are connected to the second input, NOUT3, of the voting structure 1, VS1. The source of PFET, MP15, is connected to VDD. The source of NFET, MN15, is connected to GND. The drain, 403, of PFET, MP15, is connected to the source of PFET, MP16, 403. The drain, VS1OUT, of PFET, MP16, is connected to the drain of NFET, MN16, and VS1OUT. The source, 404, of NFET, MN16, is connected to the drain of NFET, MN15, 404.

An embodiment of voting structure 2, VS2, for the triple redundant latch contains PFET, MP17, PFET, MP18, NFET, MN17, and NFET, MN18. In this embodiment, the gates of PFET, MP17, and NFET, MN17, are connected to the first input, DOUT, of voting structure 2, VS2. The gates of PFET, MP18, and NFET, MN18, are connected to the second input, SOUT, of the voting structure 2, VS2. The source of PFET, MP17, is connected to VDD. The source of NFET, MN17, is connected to GND. The drain, 405, of PFET, MP17, is connected to the source of PFET, MP18, 405. The drain, VS2OUT, of PFET, MP18, is connected to the drain of NFET, MN18, and VS2OUT. The source, 406, of NFET, MN18, is connected to the drain of NFET, MN17, 406.

An embodiment of voting structure 3, VS3, for the triple redundant latch contains PFET, MP19, PFET, MP20, NFET, MN19, and NFET, MN20. In this embodiment, the gates of PFET, MP19, and NFET, MN19, are connected to the first input, OUT2, of voting structure 3, VS3. The gates of PFET, MP20, and NFET, MN20, are connected to the second input, DOUT, of the voting structure 3, VS3. The source of PFET, MP19, is connected to VDD. The source of NFET, MN19, is connected to GND. The drain, 407, of PFET, MP17, is connected to the source of PFET, MP18, 407. The drain, VS3OUT, of PFET, MP20, is connected to the drain of NFET, MN20, and VS3OUT. The source, 408, of NFET, MN20, is connected to the drain of NFET, MN19, 408.

An embodiment of Buffer 1, BUF1, for the triple redundant latch contains PFET, MP4, NFET, MN4, PFET, MP5, and NFET, MN5. In this embodiment, the gate of PFET, MP4, and the gate of NFET, MN4, is connected to the input of BUF1, OUT2. The drain of PFET, MP4, and the drain of NFET, MN4, is connected to the gate of PFET, MP5 and to the gate of NFET, MN5, 402. The drain of PFET, MP5, and NFET, MN5, are connected to the output of buffer1, BUF1, BOUT. The sources of PFET, MP4 and PFET, MP5 are connected to VDD. The sources of NFET, MN4, and NFET, MN5 are connected to GND.

FIG. 4 is a schematic of an improved triple redundant latch. An input signal drives the inputs, DIN, of transfer gate 1, TG1, and transfer gate 3, TG3. If control signal, SET is a logical high value, control signal, NSET, is a logical low value, and transfer gate 3, TG3, is active, the signal at the input, DIN, of transfer gate 1, TG1, and transfer gate 3, TG3 is transferred to the output, DOUT, of transfer gate 1, TG1, and the output, OUT2, of transfer gate 4, TG4.

The signal transferred to nodes DOUT, OUT2, and SOUT is also presented to the input, DOUT, of latch1, L1, the input, OUT2, of latch2, L2, and the input SOUT, of latch3, L3. Latches L1, L2, and L3 store the same logical value. The outputs, 401, NOUT2, and NOUT3, of latches, L1, L2 and L3 respectively, output the opposite sense of the logical value stored. The outputs, NOUT2 and NOUT3, of latches, L2, and L3 respectively, are inputs to voting structure, VS1. The inputs, NOUT2 and NOUT3, into voting structure 1, VS1, cause the output, VS1 OUT, of voting structure 1, VS1, to reinforce the signal presented at the input, DOUT, of latch1, L1, when the transfer gate 1, TG1 is off and transfer gate 2, TG2 is on.

The inputs, OUT2 and DOUT, into voting structure 3, VS3, cause the output, VS3OUT, of voting structure 3, VS3, to reinforce the signal presented at the output, SOUT, of latch3, L3, when the transfer gates, TG8 and TG9, are off and transfer gate 10, TG10 is on.

The inputs, SOUT and DOUT, into voting structure 2, VS3, cause the output, VS2OUT, of voting structure 2, VS2, to reinforce the signal presented at the input, OUT2, of latch2, L2, when the transfer gates, TG4 and TG5, are off and transfer gate 10, TG10 is on.

After control input, SET, is driven to a logical low value, and control input, NSET, is driven to a logical high value, latch1, L1, latch2, L2, and latch3, L3 store the original logical value presented on nodes DOUT, OUT2, and SOUT, respectively. If none of the nodes, DOUT, OUT2, and SOUT, is disturbed, then a signal of the same sense is presented on the output, DOUT, of the triple redundant latch.

For example, if a logical high value is stored on nodes DOUT, OUT2, and SOUT, then a logical high value is presented on the output, DOUT, of the triple redundant latch. A logical low value on the output, NOUT2, of latch2, L2, is applied to the first input of voting structure 1, VS1. A logical low value on the output, NOUT3, of latch3, L3, is applied to the second input of voting structure 1, VS1. Because control signal NTEST2 is low and control signal TEST2 is high, a logical high value is transferred from the input, VS1OUT, of the second transfer gate, TG2, to the input of latch1, L1. With these logical values applied to voting structure 1, VS1, the output, DOUT, of the triple redundant latch, remains a high logical value.

If in this example where a logical high value is stored on nodes, DOUT, OUT2, and SOUT, node DOUT is changed to a logical low value by a soft error event, DOUT will be recovered to a high logical value because the output, VS1 OUT, of the voting structure, VS1, remains high. Since TEST2 is a logical high value and NTEST2 is a logical low value, the high value on VS1OUT is transferred to DOUT.

If a single soft error event changes the logical value stored in latch3, L3, voting structure 1, VS1, will tri-state and not disturb the correct value on DOUT. If a single soft error event changes the logical value stored in latch2, L2, voting structure 1, VS1, will tri-state and not disturb the correct value on DOUT.

If, however, a soft error event changes the values stored on nodes, OUT2 and SOUT, at nearly the same time, the triple redundant latch may change from its original value. For example, if a logical high value is stored on nodes DOUT, OUT2, and SOUT, a logical high value is presented on the output, DOUT, of the triple redundant latch. If a soft error event changes the logical value stored on nodes, OUT2 and SOUT, at nearly the same time, from a logical high value to a logical low value, inputs, NOUT2 and NOUT3, into voting structure 1, VS1, change from logical low values to logical high values. Since inputs, NOUT2 and NOUT3, of voting structure 1, VS1, are a logical high value, the output, VS1OUT, is pulled to a logical low value. Because transfer gate 2, TG2, is on, the high logical value stored on latch1, L1, is then flipped to a logical low value. The output, DOUT, of the triple redundant latch, is then changed from a logical high value to a logical low value. The triple redundant latch should not fail unless two or more soft error events occur at nearly the same time. If a single soft error event occurs and changes the logical value on a settable memory element, the voting structure on that settable memory element will restore the correct value to that settable memory element.

The original logical value stored in the triple redundant latch may be scanned from the triple redundant latch for test purposes. The logical value held in latch 2, L2, is presented to the input, OUT2, of buffer1, BUF1. The output, BOUT, of buffer 1, BUF1, is presented to the input of transfer gate 9, TG9. Driving control signal, NSHIFT, high, and driving control signal, SHIFT, low, allows the logical value presented on BOUT to be propagated to the output, SOUT and stored in latch 3, L3. The logical value on SOUT may be scanned to a tester to be evaluated.

Scan data, SIN, may also be scanned into the triple redundant latch. When control signal, SHIFT, is driven high, NSHIFT, is driven low, and control signal, SET, is driven low, scan data, SIN, may be transferred through transfer gate 5, TG5, into latch2, L2. Next, the scan data is propagated through buffer 1, BUF1, and presented to the input of transfer gate 9, TG9. Scan data may be scanned into latch 3, L3, by keeping control signal, SET, low, driving control signal SHIFT, low, and driving control signal, NSHIFT, high. The logical value scanned into latches, L2 and L3, is then forced into latch 1, L1, because the output, VS1 OUT, of voting structure 1, VS1, produces the same logical value when latches, L2 and L3, have the same logical value.

During sample-on-the-fly, the test mode may be turned on with the system clocks running. The initial logical values stored in latches, L2 and L3 will be the same as the logical value stored in latch 1, L1. As the system clocks run, the logical value in latch 1, L1, will possibly change. On any subsequent system clock cycle, the signal, SAMPLE, may be activated to load the latest value from latch 1, L1, to latches, L2 and L3. After loading this logical value into latches, L2 and L3, the logical value may be scanned out using the control signals, SHIFT and NSHIFT.

In addition to improving the soft error rate of a latch, the triple redundant latch shown in FIG. 4 also reduces the delay time through a triple redundant latch because the number of logic delays is reduced.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A triple redundant latch for reducing soft errors comprising:
    a) a first settable memory element;
    b) a second settable memory element;
    c) a third settable memory element;
    d) a first voting structure;
    e) a second voting structure;
    f) a third voting structure;
    g) a first buffer;
    h) wherein an identical logic value is set in each settable memory element;
    i) wherein inputs to the first voting structure are provided by the second settable memory element and the third settable memory element;
    j) wherein inputs to the second voting structure are provided by the first settable memory element and the third settable memory element;
    k) wherein inputs to the third voting structure are provided by the second settable memory element and the first settable memory element;
    l) wherein an output of the first voting structure determines a logical value held on the first settable memory element after the first settable memory element, the second settable memory element, and the third settable memory element are set;
    m) wherein an output of the second voting structure determines a logical value held on the second settable memory element after the first settable memory element, the second settable memory element, and the third settable memory element are set;
    n) wherein an output of the third voting structure determines a logical value held on the third settable memory element after the first settable memory element, the second settable memory element, and the third settable memory element are set,
    o) wherein scan data or scanned into the second settable memory element;
    p) wherein data or scanned out of the second settable memory element into the buffer,
    q) wherein data or scanned from the buffer into third settable memory element;
    r) wherein data or scanned out of the third settable memory element;
    s) wherein a propagation delay through the first settable memory element is the only propagation delay of the triple redundant latch.

2. The triple redundant latch as in claim 1 wherein scan data may be scanned with system clocks halted.

3. The triple redundant latch as in claim 1 wherein scan data may be scanned with system clocks running.

4. The triple redundant latch as in claim 1 wherein the first settable memory element comprises:
    t) a first transfer gate;
    u) a second transfer gate;
    v) a latch.

5. The triple redundant latch as in claim 4 wherein the transfer gates consist of complementary pass gates.

6. The triple redundant latch as in claim 4 wherein the transfer gates consist of NFET-only pass gates.

7. The triple redundant latch as in claim 4 wherein the transfer gates consist of PFET-only pass gates.

8. The triple redundant latch as in claim 1 wherein the second settable memory element comprises:
   w) a first transfer gate;
   x) a second transfer gate;
   y) a third transfer gate;
   z) a fourth transfer gate;
   aa) a fifth transfer gate;
   bb) a latch.

9. The triple redundant latch as in claim 8 wherein the transfer gates consist of complementary pass gates.

10. The triple redundant latch as in claim 8 wherein the transfer gates consist of NFET-only pass gates.

11. The triple redundant latch as in claim 8 wherein the transfer gates consist of PFET-only pass gates.

12. The triple redundant latch as in claim 1 wherein the third settable memory element comprises:
   cc) a first transfer gate;
   dd) a second transfer gate;
   ee) a third transfer gate;
   ff) a latch.

13. The triple redundant latch as in claim 12 wherein the transfer gates consist of complementary pass gates.

14. The triple redundant latch as in claim 12 wherein the transfer gates consist of NFET-only pass gates.

15. The triple redundant latch as in claim 12 wherein the transfer gates consist of PFET-only pass gates.

16. The triple redundant latch as in claim 1 wherein the first voting structure comprises:
   gg) a first input;
   hh) a second input;
   ii) an output;
   jj) such that the first input is connected to an output of the second settable memory element;
   kk) such that the second input is connected to an output of the third settable memory element;
   ll) such that the output of the first voting structure forces the logical value initially stored in the triple redundant latch on to the first settable memory element if the second and third settable memory elements contain the logical value initially stored in the triple redundant latch.

17. The triple redundant latch as in claim 1 wherein the second voting structure comprises:
   a) a first input;
   b) a second input;
   c) an output;
   d) such that the first input is connected to an output of the first settable memory element;
   e) such that the second input is connected to an output of the third settable memory element;
   f) such that the output of the second voting structure forces the logical value initially stored in the triple redundant latch on to the second settable memory element if the first and third settable memory elements contain the logical value initially stored in the triple redundant latch.

18. The triple redundant latch as in claim 1 wherein the third voting structure comprises:
   a) a first input;
   b) a second input;
   c) an output;
   d) such that the first input is connected to an output of the second settable memory element;
   e) such that the second input is connected to an output of the first settable memory element;
   f) such that the output of the third voting structure forces the logical value initially stored in the triple redundant latch on to the third settable memory element if the second and first settable memory elements contain the logical value initially stored in the triple redundant latch.

19. A triple redundant latch for reducing soft errors comprising:
   a) a first memory means for setting and retaining a logical value;
   b) a second memory means for setting and retaining a logical value;
   c) a third memory means for setting and retaining a logical value;
   d) a first voting means for setting into the first memory means a logical value determined by inputs provided by the second and third memory means for setting and retaining a logical value;
   e) a second voting means for setting into the second memory means a logical value determined by inputs provided by the first and third memory means for setting and retaining a logical value;
   f) a third voting means for setting into the third memory means a logical value determined by inputs provided by the first and second memory means for setting and retaining a logical value;
   g) a buffer means for buffering the output of the second memory means for setting and retaining a logical value into the input of the third memory means for setting and retaining a logical value;
   h) wherein an identical logic value is set in each memory means; and
   i) wherein a propagation delay through the first memory means is the only propagation delay of the triple redundant latch.

* * * * *

UNITED STATES PATENT AND TRADEMARK OFFICE
CERTIFICATE OF CORRECTION

PATENT NO. : 7,027,333 B2 Page 1 of 1
APPLICATION NO. : 10/934035
DATED : April 11, 2006
INVENTOR(S) : John T. Petersen et al.

It is certified that error appears in the above-identified patent and that said Letters Patent is hereby corrected as shown below:

In column 12, line 41, in Claim 1, delete "set," and insert -- set; --, therefor.

In column 12, line 42, in Claim 1, delete "or" and insert -- is --, therefor.

In column 12, line 44, in Claim 1, delete "or" and insert -- is --, therefor.

In column 12, line 45, in Claim 1, delete "buffer," and insert -- buffer; --, therefor.

In column 12, line 46, in Claim 1, delete "or" and insert -- is --, therefor.

In column 12, line 48, in Claim 1, delete "or" and insert -- is --, therefor.

Signed and Sealed this

Twenty-sixth Day of May, 2009

JOHN DOLL
*Acting Director of the United States Patent and Trademark Office*